United States Patent
Pettus et al.

(10) Patent No.: US 9,088,058 B2
(45) Date of Patent: Jul. 21, 2015

(54) WAVEGUIDE INTERFACE WITH A LAUNCH TRANSDUCER AND A CIRCULAR INTERFACE PLATE

(75) Inventors: Michael Gregory Pettus, Laguna Niguel, CA (US); James Robert Amos Bardeen, Los Angeles, CA (US)

(73) Assignee: Vubiq Networks, Inc., Irvine, CA (US)

(*) Notice: Subject to any disclaimer, the term of this patent is extended or adjusted under 35 U.S.C. 154(b) by 241 days.

(21) Appl. No.: 13/383,203

(22) PCT Filed: Aug. 19, 2010

(86) PCT No.: PCT/US2010/046028
§ 371 (c)(1),
(2), (4) Date: Jan. 9, 2012

(87) PCT Pub. No.: WO2011/022556
PCT Pub. Date: Feb. 24, 2011

(65) Prior Publication Data
US 2012/0194303 A1    Aug. 2, 2012

Related U.S. Application Data

(60) Provisional application No. 61/235,245, filed on Aug. 19, 2009.

(51) Int. Cl.
*H01P 5/107* (2006.01)
*H01P 1/04* (2006.01)
(Continued)

(52) U.S. Cl.
CPC ............ *H01P 1/042* (2013.01); *H01P 5/107* (2013.01); *H01Q 1/38* (2013.01); *H01Q 9/28* (2013.01); *Y10T 29/49018* (2015.01)

(58) Field of Classification Search
CPC .............................. H01P 5/107; H01P 5/1015
USPC ..................................... 333/26, 247
See application file for complete search history.

(56) References Cited

U.S. PATENT DOCUMENTS 3,265,995 A * 8/1966 Hamasaki ................ 333/21 R
4,684,952 A   8/1987 Munson et al.
(Continued)

FOREIGN PATENT DOCUMENTS

DE         4127892 A1    2/1993
DE   102004045707 A1    3/2006
(Continued)

OTHER PUBLICATIONS

Zhang, W. et al., "3D Beamforming for Wireless Data Centers," Hotnets '11, Cambridge, MA, Nov. 14-15, 2011.
(Continued)

*Primary Examiner* — Benny Lee
(74) *Attorney, Agent, or Firm* — LeClairRyan, a Professional Corporation

(57) ABSTRACT

A waveguide interface and a method of manufacturing is disclosed. The interface includes a support block that has a printed circuit board. A communication device is coupled to the circuit board. A launch transducer is positioned adjacent to and coupled to the communication device. The launch transducer includes one or more transmission lines in a first portion and at least one antenna element in a second portion. The antenna element radiates millimeter wave frequency signals. An interface plate coupled to the support block has a rectangular slot having predetermined dimensions. A waveguide component is coupled to the interface plate and has a waveguide opening. The first portion of the launch transducer is positioned within the slot such that the slot prevents energy from the transmission line from emitting toward the circuit board or the waveguide opening but allows energy to pass from the antenna element into the waveguide opening.

23 Claims, 12 Drawing Sheets

(51) Int. Cl.
*H01Q 1/38* (2006.01)
*H01Q 9/28* (2006.01)

(56) References Cited

U.S. PATENT DOCUMENTS

| | | |
|---|---|---|
| 4,752,680 A | 6/1988 | Larsson |
| 4,939,726 A | 7/1990 | Flammer et al. |
| 5,007,052 A | 4/1991 | Flammer |
| 5,079,768 A | 1/1992 | Flammer |
| 5,103,210 A | 4/1992 | Rode et al. |
| 5,115,433 A | 5/1992 | Baran et al. |
| 5,130,987 A | 7/1992 | Flammer |
| 5,198,786 A * | 3/1993 | Russell et al. .............. 333/26 |
| 5,218,189 A | 6/1993 | Hutchison |
| 5,276,345 A | 1/1994 | Siegel et al. |
| 5,347,287 A | 9/1994 | Speciale |
| 5,444,223 A | 8/1995 | Blama |
| 5,465,398 A | 11/1995 | Flammer |
| 5,479,400 A | 12/1995 | Dilworth et al. |
| 5,486,830 A | 1/1996 | Axline, Jr. et al. |
| 5,488,608 A | 1/1996 | Flammer, III |
| 5,515,369 A | 5/1996 | Flammer, III et al. |
| 5,570,084 A | 10/1996 | Ritter et al. |
| 5,726,630 A | 3/1998 | Marsh et al. |
| 5,754,948 A | 5/1998 | Metze |
| 5,767,802 A | 6/1998 | Kosowsky et al. |
| 5,784,543 A | 7/1998 | Marchand |
| 5,864,061 A | 1/1999 | Dilz, Jr. |
| 5,903,239 A | 5/1999 | Takahashi et al. |
| 5,903,566 A | 5/1999 | Flammer, III |
| 5,960,029 A | 9/1999 | Kim et al. |
| 6,027,027 A | 2/2000 | Smithgall |
| 6,028,560 A | 2/2000 | Pfizenmaier et al. |
| 6,037,894 A | 3/2000 | Pfizenmaier et al. |
| 6,104,333 A | 8/2000 | Wood, Jr. |
| 6,236,366 B1 | 5/2001 | Yamamoto et al. |
| 6,236,761 B1 | 5/2001 | Marchand |
| 6,366,245 B1 | 4/2002 | Schmidt et al. |
| 6,424,315 B1 | 7/2002 | Glenn et al. |
| 6,427,922 B1 | 8/2002 | Marchand |
| 6,476,756 B2 | 11/2002 | Landt |
| 6,509,836 B1 | 1/2003 | Ingram |
| 6,542,083 B1 | 4/2003 | Richley et al. |
| 6,545,646 B2 | 4/2003 | Marchand |
| 6,547,140 B2 | 4/2003 | Marchand |
| 6,600,428 B1 | 7/2003 | O'Toole et al. |
| 6,696,879 B1 | 2/2004 | Tuttle et al. |
| 6,708,881 B2 | 3/2004 | Hartmann |
| 6,721,289 B1 | 4/2004 | O'Toole et al. |
| 6,735,183 B2 | 5/2004 | O'Toole et al. |
| 6,771,981 B1 | 8/2004 | Zalewski et al. |
| 6,820,897 B2 | 11/2004 | Breed et al. |
| 6,836,472 B2 | 12/2004 | O'Toole et al. |
| 6,867,983 B2 | 3/2005 | Liu et al. |
| 6,874,639 B2 | 4/2005 | Lawandy |
| 6,891,391 B2 | 5/2005 | Hiroki |
| 6,972,714 B1 | 12/2005 | Baharav et al. |
| 7,289,065 B2 | 10/2007 | Prieto-Burgos et al. |
| 7,295,161 B2 | 11/2007 | Gaucher et al. |
| RE40,253 E | 4/2008 | Kim et al. |
| 7,372,408 B2 | 5/2008 | Gaucher et al. |
| 7,373,107 B1 | 5/2008 | Wesolowski |
| RE40,385 E | 6/2008 | Bang et al. |
| 7,443,906 B1 | 10/2008 | Bang et al. |
| RE41,531 E | 8/2010 | Wood, Jr. |
| 2002/0140557 A1 | 10/2002 | Dukler et al. |
| 2003/0002029 A1 | 1/2003 | Dukler et al. |
| 2003/0035131 A1 | 2/2003 | Dukler et al. |
| 2003/0137446 A1 | 7/2003 | Vavik |
| 2004/0159708 A1 | 8/2004 | Yogev et al. |
| 2004/0169847 A1 | 9/2004 | Dukler |
| 2004/0211840 A1 | 10/2004 | Yogev et al. |
| 2004/0217171 A1 | 11/2004 | DeVos et al. |
| 2006/0109176 A1 | 5/2006 | Lee et al. |
| 2007/0103380 A1 | 5/2007 | Weste |
| 2007/0229182 A1 | 10/2007 | Gaucher et al. |
| 2008/0218413 A1 | 9/2008 | Li et al. |

FOREIGN PATENT DOCUMENTS

| | | |
|---|---|---|
| EP | 0766410 A2 | 4/1997 |
| EP | 0884799 A2 | 12/1998 |
| EP | 1357395 A1 | 10/2003 |
| JP | 2006279199 A | 10/2006 |
| KR | 20060010867 A | 2/2006 |
| WO | 0065691 A1 | 11/2000 |
| WO | 2004004083 A1 | 1/2004 |
| WO | 2006007002 A1 | 1/2006 |
| WO | 2006102749 A1 | 10/2006 |

OTHER PUBLICATIONS

International Search Report and Written Opinion for International Patent Application No. PCT/US2010/046028 (Apr. 25, 2011).

Abele, P. et al., "Wafer Level Integration of a 24 GHz Differential SiGe-MMIC Oscillator with a Patch Antenna using BCB as a Dielectric Layer," 11th GAAS Symposium, 2003.

Agarwal, B et al. "A Transferred-Substrate HBT Wide-Band Differential Amplifier to 50 GHz," IEEE Microwave and Guided Wave Letters, vol. 8, No. 7, Jul. 1998.

Al-Fares et al. "A Scalable, Commodity Data Center Network Architecture," SIGCOMM '08, Seattle, WA, Aug. 17-22, 2008.

Aoki, S. et al., "A Flip Chip Bonding Technology Using Gold Pillars for Millimeter-Wave Applications," IEEE MTT-S Digest, 1997.

Bodo, P., "Low Cost Interconnect, Packaging and Sub-System Integration Technologies for Millimetrere-wave Applications," Temadag Framtidens Radar Front-End Jönköping, Mar. 9, 2005.

Boustedt, K., "GHz Flip Chip—An Overview," Ericsson Microwave Systems AB, Core Unit Research Center Microwave and High Speed Electronics, 2005.

Brauner, T., "A Differential Active Patch Antenna Element for Array Applications," IEEE Microwave and Wireless Components Letters, vol. 13, No. 4, Apr. 2003.

Clos, C., "A Study of Non-Blocking Switching Networks," The Bell System Technical Journal, Oct. 30, 1952.

Cui, Y. et al., "Wireless Data Center Networking," IEEE Wireless Communications, Dec. 2011.

Cui, Y. et al., "Channel Allocation in Wireless Data Center Networks," IEEE INFOCOM Technical Paper, 2011.

Deal, W. et al., "Integrated-Antenna Push-Pull Power Amplifiers," IEEE Transactions on Microwave Theory and Techniques, vol. 47, No. 8, Aug. 1999.

Gilleo, K., "Chip Scale or Flip Scale-the Wrong Question?", Cookson Electronics, 1998.

Halperin, D. et al., "Augmenting Data Center Networks with Multi-Gigabit Wireless Links," SIGCOMM '11 Toronto, Ontario, Canada, Aug. 15-19, 2011.

Hang, C. et al., "High-Efficiency Push-Pull Power Amplifier Integrated with Quasi-Yagi Antenna," IEEE Transactions on Microwave Theory and Techniques, vol. 49, No. 6, Jun. 2001.

Higginbotham, S., "Forget Ethernet, Researchers Want Data Centers to Go Wireless," Internet article, Dec. 20, 2011.

Jentzsch, A. et al., "Theory and Measurements of Flip-Chip Interconnects for Frequencies up to 100 GHz," IEEE Transactions on Microwave Theory and Techniques, vol. 49, No. 5, May 2001.

Karnfelt, C. et al, "Flip Chip Assembly of a 40-60 GHz GaAs Microstrip Amplifier," 12th GAAS® Symposium—Amsterdam, 2004.

Katayama Y. et al., "Wireless Data Center Networking with Steered-Beam mmWave Links," IEEE WCNC 2011—Service and Application, 2011.

Graham-Rowe, D., "Bouncing Data Would Speed Up Data Centers," MIT Published Article, http://www.technologyreview.com/communications/39367/?ref=rss, Dec. 20, 2011.

Owano, N., "Bouncing Signals Off Ceiling Can Rev Up Data Centers," PhysOrg.com, Published Dec. 21, 2011.

(56) References Cited

OTHER PUBLICATIONS

Pfeiffer, U., et al., "A 60GHz Radio Chipset Fully-Integrated in a Low-Cost Packaging Technology," 2006 Electronic Components and Technology Conference, 2006.

Pfeiffer, U., et al., "A Chip-Scale Packaging Technology for 60-GHz Wireless Chip Sets," IEEE Transactions on Microwave Theory and Techniques, vol. 54, No. 8, Aug. 2006.

Pfeiffer, U., et al., "Equivalent Circuit Model Extraction of Flip-Chip Ball Interconnects Based on Direct Probing Techniques," IEEE Microwave and Wireless Components Letters, vol. 15, No. 9, Sep. 2005.

Pfeiffer, U., "Low-loss Contact Pad with Tuned Impedance for Operation at Millimeter Wave Frequencies," IEEE SPI 2005, 2005.

Ramachandran, K. et al., "60 GHz Data-Center Networking: Wireless Worry Less?" WINLAB, Rutgers University and NEC Laboratories America, NJ, Jul. 14, 2008.

Schrank, H. et al., "Analysis of the Radiation Resistance and Gain of a Full-Wave Dipole," IEEE Antennas and Propagation Magazine, vol. 36, No. 5, Oct. 1994.

Shin, J. et al., "On the Feasibility of Completely Wireless Data Centers," Department of Computer Science, Cornell University and Microsoft Research, May 3, 2011.

Staiculescu, D. et al., "Flip Chip vs. Wirebond," Printed Circuit Design, Jun. 2012.

Barroso, L. et al., "The Datacenter as a Computer, An Introduction to the Design of Warehouse Scale Machines", 2009.

Vardhan, H. et al., "Wireless Data Center with Millimeter Wave Network," IEEE Globecom 2010 Proceedings, 2010.

Viallon, C. et al., "Microwave Differential Structures Optimization: Application to a Double Balanced SiGe Active Down-Converter Design," IEEE International Workshop on Radio-Frequency Integration Technology, Singapore, Nov. 30-Dec. 2, 2005.

\* cited by examiner

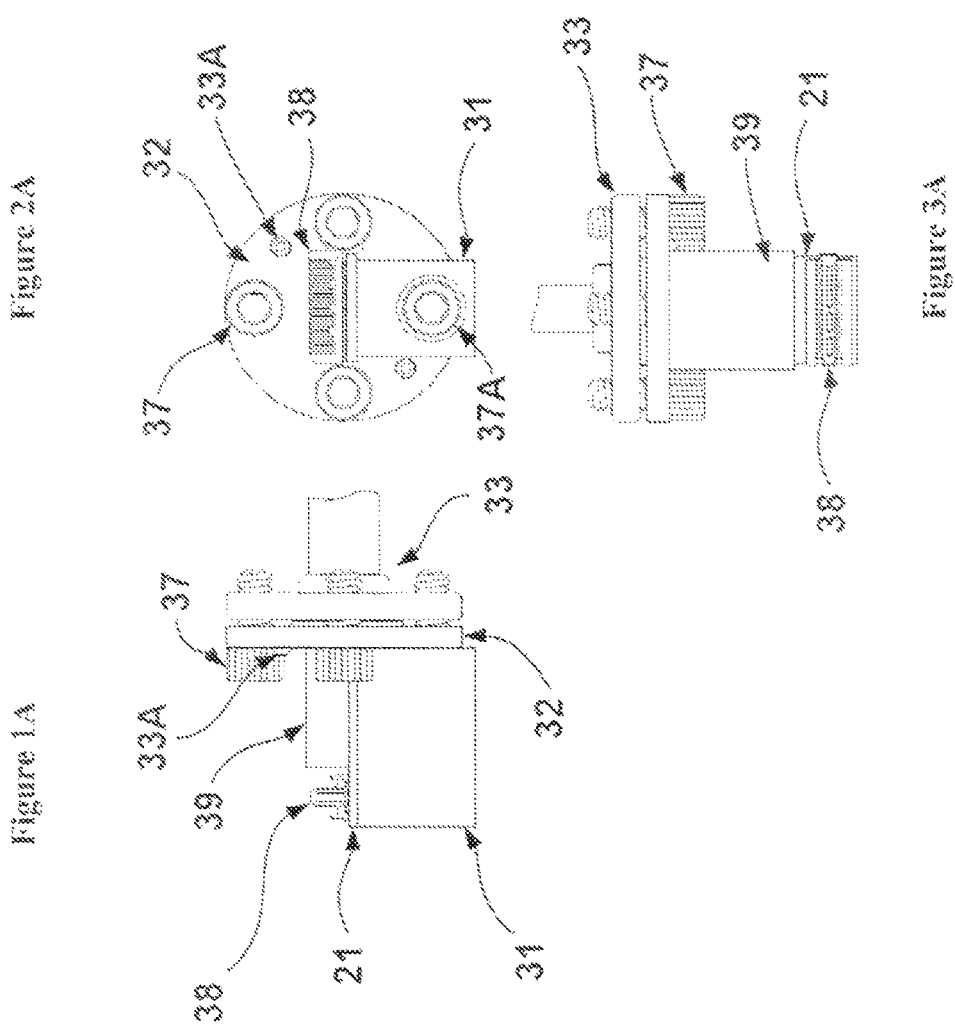

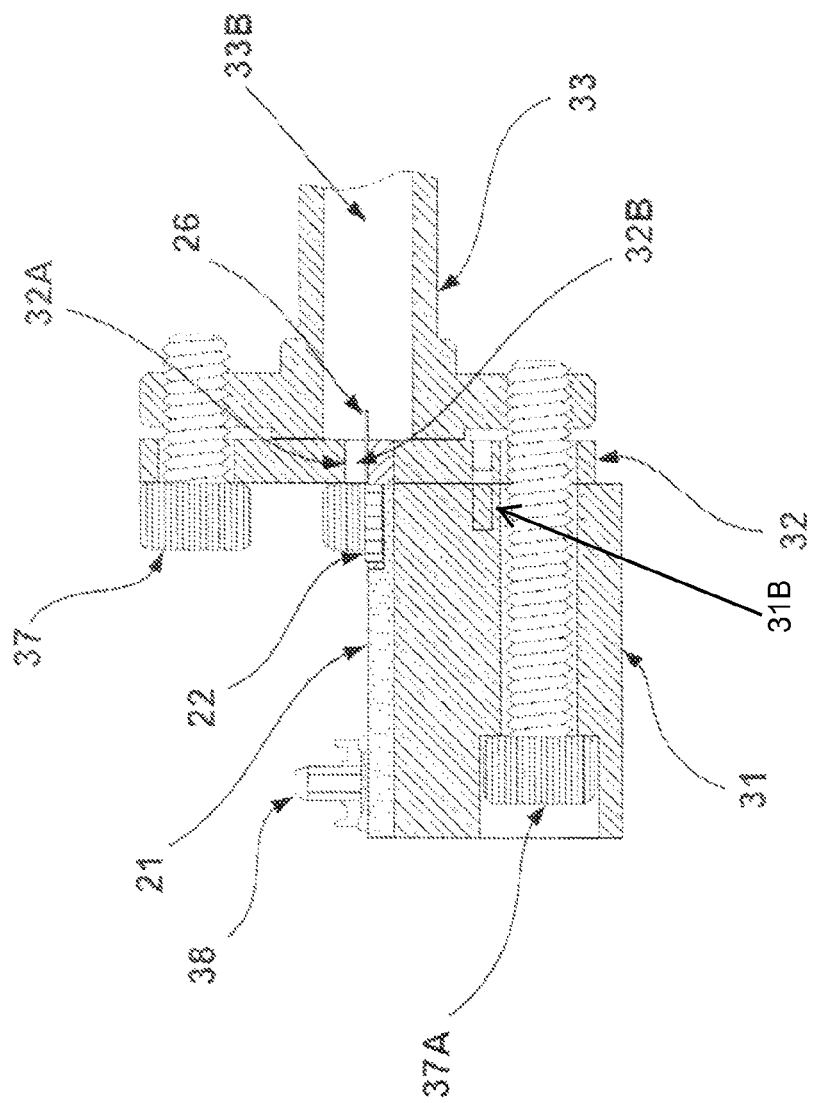

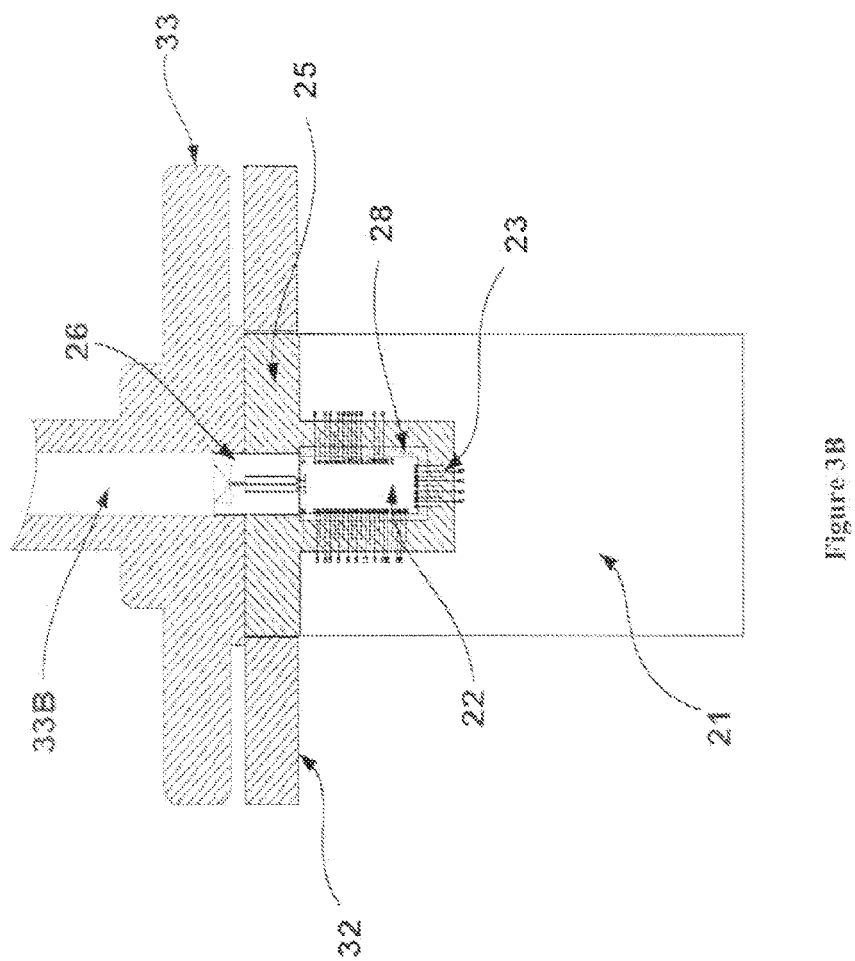

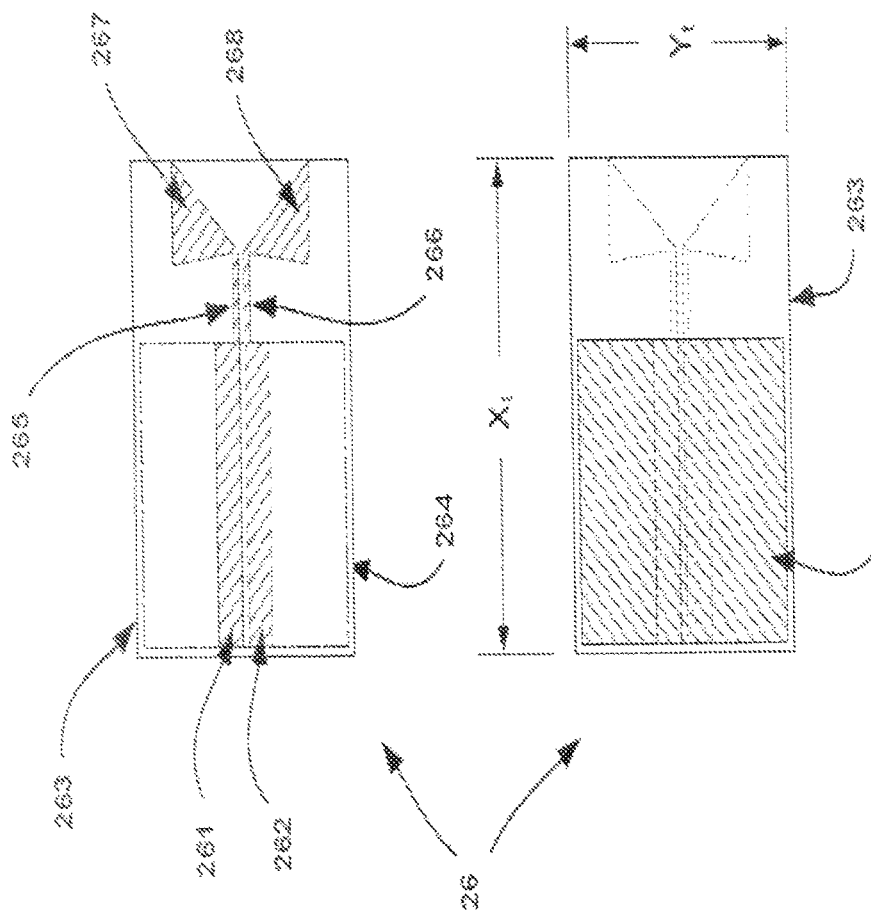

WAVEGUIDE INTERFACE WITH A LAUNCH TRANSDUCER AND A CIRCULAR INTERFACE PLATE

STATEMENT OF RELATED APPLICATIONS

The present application is national phase filing under 35 USC 371 of International Application No. PCT/US2010/046028 having an International Filing Date of 19, Aug. 2010 and entitled, "Precision Waveguide Interface", of which claims the benefit of priority based on U.S. Provisional Patent Application Ser. No. 61/235,245, filed on 19, Aug. 2009, both of the above in the name of inventors Michael G. Pettus and James R. A. Bardeen, all of the above applications commonly owned herewith.

TECHNICAL FIELD

The present disclosure relates generally to microwave and millimeter wave radio frequency waveguide interface technologies.

BACKGROUND

As the semiconductor industry continues to increase circuit complexity and density by reduction of process node geometries, operating signal frequencies continue to increase. It is now possible to obtain semiconductors that operate well into the millimeter wave region of radio spectrum (30 GHz to 300 GHz). Traditionally the types of semiconductors used have been in the category of "III-V" types, indicating that the semiconductor compounds have been derived from period table elements in the third and fifth columns. Examples of these are gallium arsenide (GaAs) and indium phosphide (InP). In recent years, less expensive semiconductor processes that arise from column IV (such as silicon and germanium, Si and Ge) have been produced in silicon CMOS (complementary metal oxide semiconductor) and silicon germanium (SiGe) compounds. The result has been to extend the operating frequency of low-cost silicon well into the 60 to 80 GHz range of frequencies. By having low-cost semiconductor technology available, it has put pressure on the millimeter wave manufactures to bring the overall costs down for the electromechanical support mechanisms that enable these semiconductor devices.

Commercial waveguide structures enable low-loss energy transfer at millimeter wave frequencies, with the additional benefit of having been standardized on size and mechanical coupling flange designs. By having standardized sizes and coupling flanges, interoperability between different devices and different manufactures is enabled, providing maximal flexibility for millimeter wave system design. The traditional method for interfacing semiconductor devices within a mechanical waveguide has been to either provide a split-cavity type of assembly with expensive precision machining requirements or to couple energy from an orthogonal planar printed circuit launch probe with associated lossy energy transfer. In addition, with new semiconductor designs providing balanced transmission line outputs, there has been no straightforward electromechanical method for coupling millimeter wave energy from the balanced outputs directly to a waveguide without added circuitry such as a balun transformer which is also exhibits excessive losses as the frequency range of operation increases.

The prior art methods for coupling energy into and out of semiconductor devices can be divided into two categories. The first is the use of split-cavity metallic structures that allow the semiconductor chip to be placed into one of the cavities, with the other half of the cavity then brought together with the first half with precision fit. The typical precision required for the internal dimensions of a millimeter wave waveguide is on the order of ±0.001" (0.025 mm). Holding this precision in the construction of the upper and lower cavity halves through machining, and maintaining registration alignment for assembly is expensive.

The second method used is to provide a printed circuit board with a stub or paddle energy launch. The stub or paddle launch is orthogonal to the waveguide cavity, also requiring a split-cavity type of assembly method.

In each case a custom, highly precision machining process is required to maintain the internal waveguide dimensional requirements. Some cost reduction can be afforded through a casting process, but secondary machining operations are still necessary to realize the precision needed.

The above methods are also designed for single-ended circuit configurations only. It is necessary to provide low-cost and efficient coupling methods for both single-ended and differential circuits. Millimeter wave semiconductor circuit designs often make use of differential amplifier and output stage configurations to enable high gain and power efficiencies.

What is needed is a low-cost and highly efficient coupling technique for semiconductor microwave, millimeter wave and sub-millimeter wave device energy transfer to and from standardized waveguide structures.

BRIEF DESCRIPTION OF THE DRAWINGS

The accompanying drawings illustrate one or more exemplary embodiments.

In the drawings:

FIG. 1A illustrates a side view of a waveguide interface in accordance with an embodiment;

FIG. 1B illustrates a cross sectional side view of the waveguide interface in accordance with an embodiment;

FIG. 2A illustrates a rear view of a waveguide interface in accordance with an embodiment;

FIG. 3A illustrates a top view of the waveguide interface in accordance with an embodiment;

FIG. 3B illustrates a cross sectional top view of the waveguide interface in accordance with an embodiment;

FIG. 7A illustrates a transmitter launch transducer substrate in accordance with an embodiment;

SUMMARY

Figure 2B:
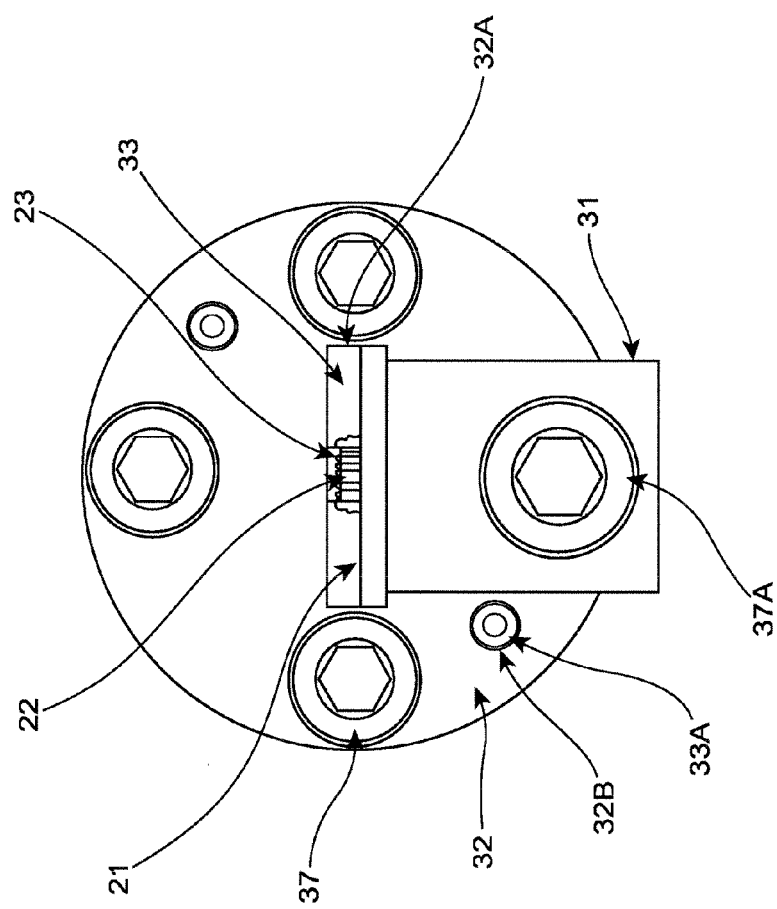
FIG. 2B illustrates a detailed rear view of the waveguide interface in accordance with an embodiment.

In an aspect, a precision waveguide interface is composed of a circular interface plate with a rectangular slot such that the slot length accepts a printed circuit board and launch transducer subassembly. The printed circuit board and launch transducer subassembly form the bottom half of a short waveguide segment within the rectangular slot of said interface plate. Due to the slot width or narrow dimension, the distance from the printed circuit assembly to the slot width upper boundary constrains the waveguide cutoff frequency of the short waveguide segment such that it is greater than the desired overall operational frequency range of the waveguide interface. By constraining the waveguide cutoff frequency of the short waveguide segment within the interface plate to a higher value than the desired operating frequency range of the waveguide interface, electromagnetic radiation transduction does not occur in this region and only electrically conducted energy is allowed to pass through the transmission line section of the launch transducer.

In another aspect, the printed circuit board contains thereon a semiconductor chip that functions as a transmitter or source of high frequency microwave, millimeter wave or sub-millimeter wave energy.

In another aspect the printed circuit board contains thereon a semiconductor chip that functions as a receiver of high frequency microwave, millimeter wave or sub-millimeter wave energy.

In another aspect the launch transducer is composed of a low-loss dielectric material such as quartz or alumina with deposited metallization such as gold, forming a transmission line and a radiating antenna element.

Known in the art are the designations for waveguide internal dimensions corresponding to the direction of the electric field vector as the E-field dimension and to the direction of the magnetic field vector as the H-field dimension.

In another aspect the interface plate is positioned flush against a standard waveguide flange such that the narrow dimension of the slot within the interface plate is orthogonal to the longer or H-field dimension (known in the art as the "a" waveguide dimension) of the standard waveguide flange. As such, the interface plate slot width constrains the waveguide segment cutoff frequency along the segment formed by the interface plate slot and the printed circuit and launch transducer subassembly until the standard waveguide flange is encountered by the conducted energy. Just beyond the location of the junction between the interface plate and the standard waveguide flange, the energy conducted within the transmission line of the launch transducer in conjunction with the radiating element is allowed to freely transduce into guided electromagnetic radiation within the standard waveguide channel volume.

In another aspect the printed circuit board and launch transducer subassembly are positioned such that the launch transducer radiating element is located within the standard waveguide area adjacent to the short waveguide segment formed by the printed circuit and launch transducer subassembly. The launch substrate transducer is configured to provide maximum energy radiation in the direction of the waveguide axis, known as an end-fire radiation pattern.

In an aspect, a waveguide interface includes a support block that has a printed circuit board. A communication device is coupled to the circuit board. A launch transducer is positioned adjacent to the circuit board and is coupled to the communication device. The launch transducer includes one or more transmission lines in a first portion and at least one antenna element in a second portion. The antenna element radiates millimeter wave frequency signals. An interface plate coupled to the support block has a rectangular slot having predetermined dimensions. A waveguide component is coupled to the interface plate and has a waveguide opening. The first portion of the launch transducer is positioned within the slot such that the slot prevents energy from the transmission line from emitting toward the circuit board or the waveguide opening but allows energy to pass from the antenna element into the waveguide opening.

In an aspect, a method of forming a precision waveguide interface comprising: selecting a support block including a printed circuit board, the support block oriented along a plane; coupling a communication device to the printed circuit board; coupling a launch transducer to the communication device, wherein the launch transducer is positioned adjacent to the printed circuit board, the launch transducer including one or more transmission lines in a first portion of the launch transducer and at least one antenna element coupled to the one or more transmission lines in a second portion of the launch transducer, wherein the at least one antenna element is configured to radiate millimeter wave frequency signals; coupling a circular interface plate to an end of the support block and oriented perpendicular to the plane, the interface plane having a rectangular slot having predetermined dimensions; and coupling a waveguide component to the interface plate, the waveguide component having a waveguide opening, wherein the first portion of the launch transducer is positioned within the rectangular slot such that the rectangular slot prevents energy from the transmission line from being emitted toward the printed circuit board or the waveguide opening and allows energy to pass from the at least one antenna element into the waveguide opening.

In an aspect, the second portion of the launch transducer is positioned within the waveguide opening. The launch transducer is positioned midway between opposing width edges of the support block. The communication device is positioned within a recess in the printed circuit board such that the first portion of the transducer is at a predetermined height within the rectangular slot. The launch substrate transducer is configured to provide maximum energy radiation in the direction of the waveguide axis.

DETAILED DESCRIPTION

Various example embodiments are described herein in the context of a precision waveguide interface. Those of ordinary skill in the art will realize that the following detailed description of the present invention is illustrative only and is not intended to be in any way limiting. Other embodiments of the present invention will readily suggest themselves to such skilled persons having the benefit of this disclosure. Reference will now be made in detail to the exemplary implementations of the present invention as illustrated in the accompanying drawings. The same reference indicators will be used throughout the drawings and the following detailed descriptions to refer to the same or like parts and may not be described with respect to all drawing figures in which they appear.

In an embodiment, the waveguide interface utilizes 60 GHz millimeter wave launch transducer antennas and enabled communication devices, although not limited thereto. As described below, an embodiment of the inventive subject matter will be discussed in relation to various types of launch transducer antennas, whereby each launch transducer antenna is coupled to a respective communication device. Also as described below, an embodiment of the inventive subject matter will be discussed in the contexts of electromagnetic transmission and electromagnetic reception. Those of ordinary skill in the art will realize that both the transmission context and the reception context equally apply due to the Lorentz electromagnetic reciprocity theorem.

In general, the following is directed to an interface between a standard waveguide flange structure and an enabled communication device. The lower-frequency electrical signals and power connections to the communication device are made to the waveguide interface through a multi-pin connector on the printed circuit board at the rear of the waveguide interface assembly; the high frequency millimeter wave electromagnetic energy is guided by the standard waveguide structure.

In an embodiment, the enabled communication device is a highly integrated millimeter wave radio transmitter that is attached to the printed circuit assembly. In another embodiment the enabled communication device is a highly integrated millimeter wave radio receiver that is attached to the printed circuit assembly. In an embodiment, the communication device is a silicon germanium (SiGe) chip although gallium arsenide (GaAs), complimentary metal oxide semiconductor (CMOS), or other semiconductor chips are contemplated. The details of the workings of the communication device are known in the art and are not discussed herein.

FIGS. 1A, 2A, and 3A show a side, rear and top view, respectively, of the waveguide interface in accordance with an embodiment. As shown in FIGS. 1A, 2A, and 3A, the waveguide interface includes a printed circuit assembly 21 (FIGS. 1A, 3A), a support block 31 (FIGS. 1A, 2A), an interface plate 32 (FIGS. 1A, 2A), and a standard waveguide flange structure 33 (FIGS. 1A, 3A). The support block 31 and the interface plate 32 are coupled to the waveguide flange 33 by use of machine screws 37 and 37A (FIG. 2A) and/or other types of fasteners, which may be received through holes 32C (FIG. 4B) in the interface plate 32 prior to entry into the waveguide flange 33. Low frequency electrical signal and power connections are made to a communication device 22 (FIG. 1B) via the printed circuit board through the connector 38. The communication device 22 is preferably protected from the environment by a protective cover or encapsulant 39 as shown in FIGS. 1A and 3A. Waveguide flange guide pins 33A, as shown in FIGS. 1A, 2A, 2B, 4A, and 4C, facilitate precise alignment of interface plate 32 with standard waveguide flange 33.

FIG. 1B shows a cross sectional side view of the waveguide interface in an embodiment. As shown in FIG. 1B, the waveguide interface 30 includes a printed circuit assembly 21 having a connector 38 thereon, as well as a communication device 22, and a launch transducer 26. As shown in FIG. 1B, the waveguide interface includes a waveguide opening 33B in a waveguide flange 33. FIG. 1B also shows a short waveguide segment 32B defined by the printed circuit assembly 21 and the interface plate slot 32A. Fasteners 37 and 37A couple the support block 31 and the interface plate 32 to the waveguide flange 33, wherein the interface plate 32 is positioned between the support block 31 and the waveguide flange 33. Support block 31 also contains guide pins 31B that provide precision alignment of the mechanical interfaces between the support block 31 and the interface plate. FIG. 2B illustrates a rear view of the waveguide interface in an embodiment.

FIG. 3B illustrates a cross section top view of the waveguide interface in an embodiment. Low frequency signal and power electrical interconnection between the communication device 22 and the printed circuit assembly 21 is provided by a plurality of wire bond connections 23, although other appropriate electrical connection means are contemplated. The printed circuit assembly 21 also carries copper plating 25 in an interface region 25A to provide an electrical ground plane in the local interface region 25A of the interface plate 32 and waveguide flange assembly 33.

Figure 4B:
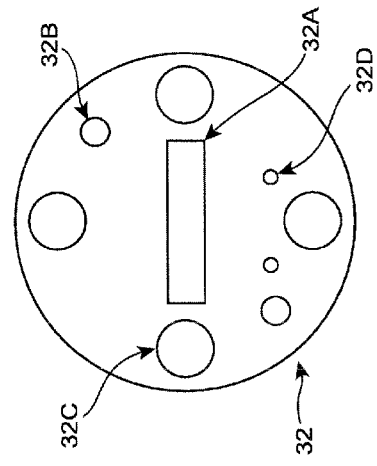
FIG. 4B illustrates an interface plate in accordance with an embodiment.
Figure 4C:
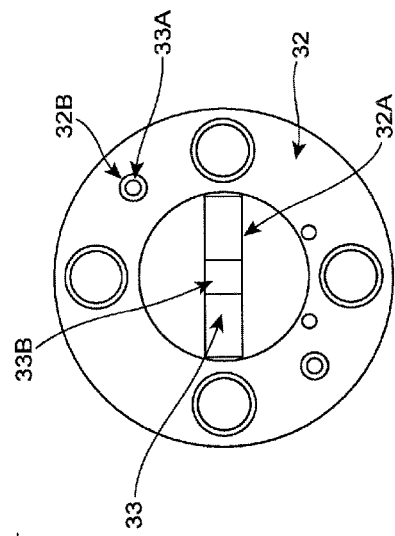
FIG. 4C illustrates the waveguide flange along with the interface plate in accordance with an embodiment.
Figure 4A:
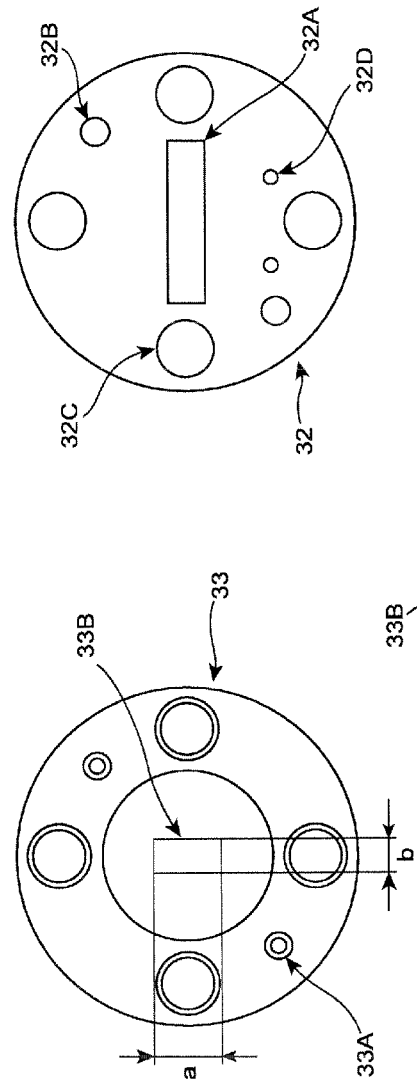
FIG. 4A illustrates a waveguide flange in accordance with an embodiment.

FIG. 4A illustrates a schematic of the waveguide flange 33 in accordance with an embodiment. FIG. 4B illustrates a schematic of the interface plate 32 in accordance with an embodiment. FIG. 4C illustrates a schematic of the waveguide flange 33 coupled to the interface plate 32 in accordance with an embodiment, wherein the interface plate 32 is aligned to the waveguide flange assembly 33 with interface plate slot 32A overlapping with the waveguide flange opening 33B. The interface plate slot 32A prevents energy from the transmission line from being emitted toward the printed circuit assembly 21 (as shown in FIGS. 1A and 3A) or the waveguide opening 33B and allows energy to pass from the antenna elements 267, 268 (as shown in FIG. 7A) into the waveguide opening 33B.

As shown in FIG. 4A, the waveguide flange 33 includes a waveguide opening 33B positioned substantially in the center of the circular waveguide flange 33. In particular, the waveguide opening 33B is rectangular having an "a" dimension representing the H-field and a "b" dimension representing the E-field for a rectangular waveguide. In an embodiment, the waveguide opening 33B dimensions are such to be utilized for the frequency range of 50 to 75 GHz, whereby the dimensions are defined by what is known categorized in the art as WR-15 or in military standard MIL-DTL-85/3C as M85/3-018. For the 50 to 75 GHz standard waveguide frequency range, also known as V-band, the "a" dimension is approximately 3.76 mm and the "b" dimension is approximately 1.88 mm. It should be noted that other "a" and "b" dimensions are contemplated for the type of application and/or the frequency range desired and thus are not limited to the values specified above. Precise alignment of interface plate 32 with standard waveguide flange 33 is facilitated by the standard waveguide flange guide pins 33A inserted into guide pin holes 32B contained within interface plate 32, as discussed above. As shown in FIG. 4B, interface plate includes interface plate machine screw holes 32C and interface plate guide pin holes 32, which are configured to receive machine screws 37 (FIG. 2B) and guide pins 31B (FIG. 1B), respectively.

Figure 5:
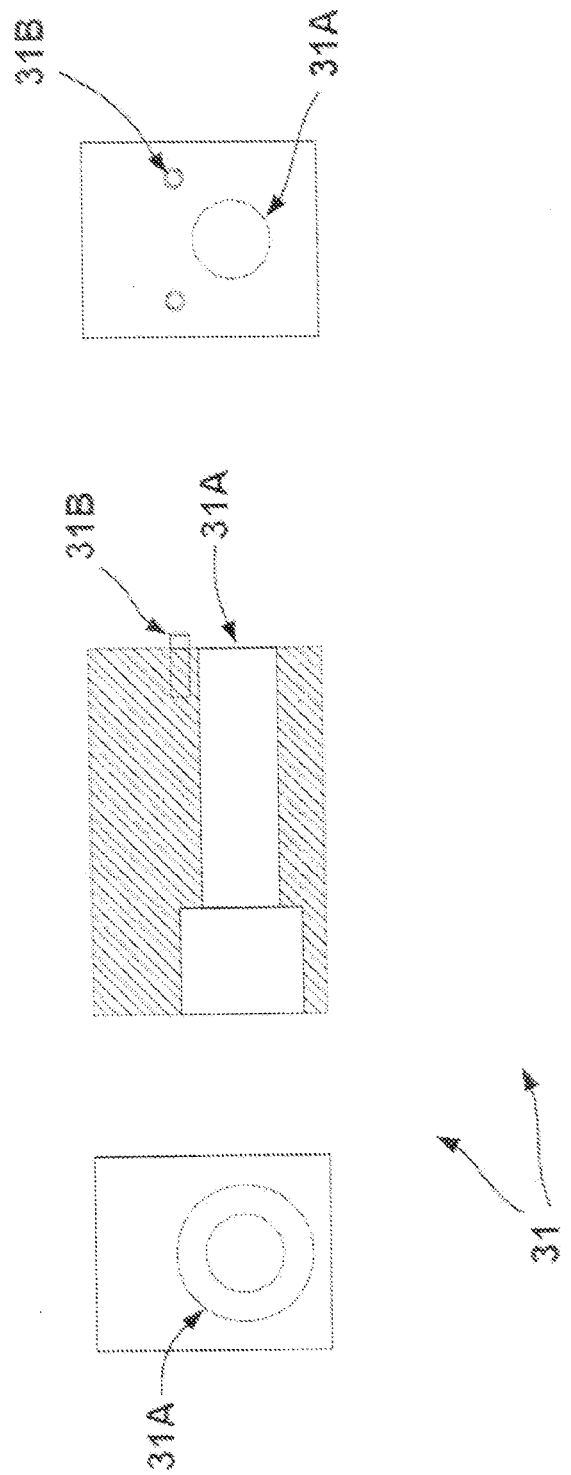
FIG. 5 illustrates a support block in accordance with an embodiment.
Figure 6A:
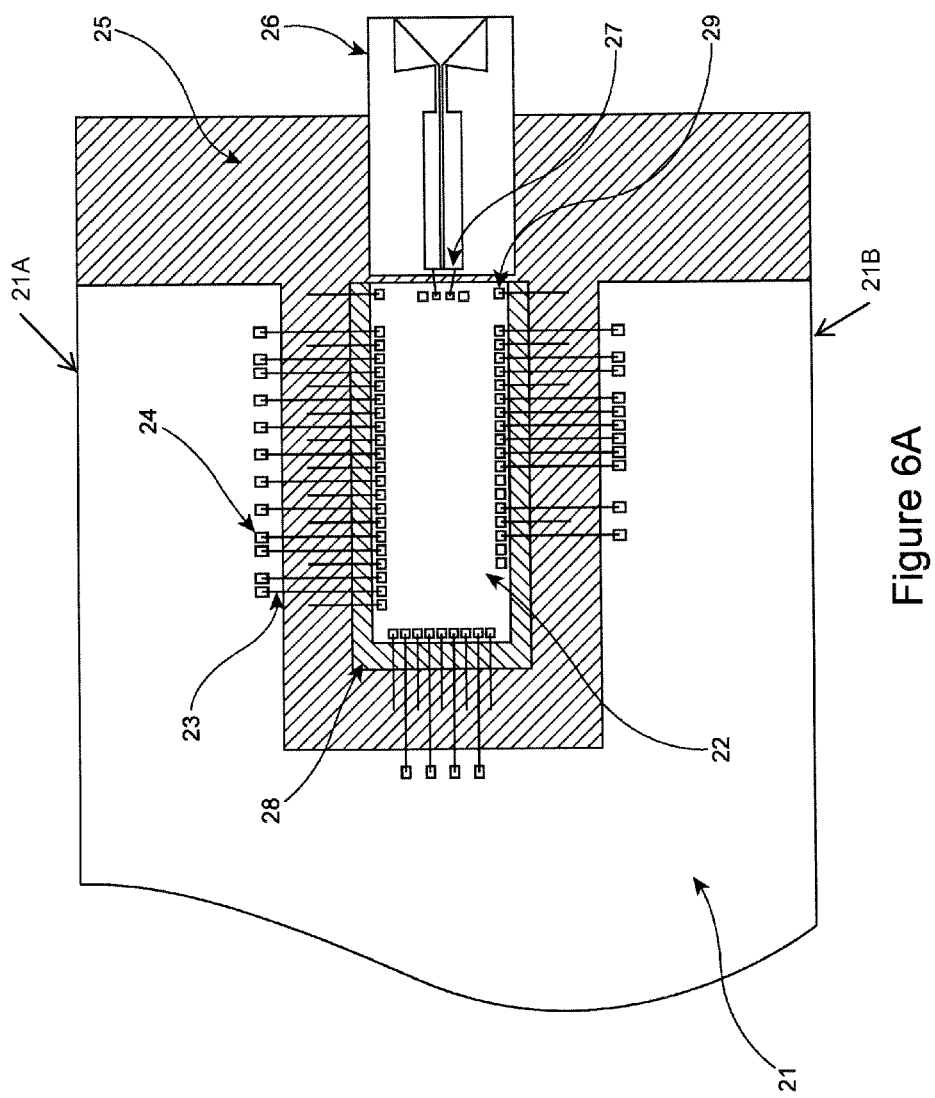
FIG. 6A illustrates a transmitter printed circuit board and launch transducer substrate assembly in accordance with an embodiment.

FIG. 5 shows support block 31 in an embodiment. The support block 31 includes a counter-bored hole 31A which allows the fastener 37A (FIG. 1B) to be inserted therein to couple the support block 31 to the waveguide flange and interface plate assembly 32, 33 as shown in FIG. 1A. In addition, the support block 31 includes one or more guide pins 31B which are aligned with the interface plate guide pin holes 32D (FIG. 4B) of the interface plate 32. The support block 31 provides support for the printed circuit assembly 21 when the waveguide interface operates as a transmitter (FIG. 1B). The support block 31 provides support for the printed circuit assembly 11 when the waveguide interface operates as a receiver (FIG. 6A). Support block 31 also provides for precise alignment of transmitter printed circuit assembly 21 and the receiver printed circuit assembly 11 with the interface plate 32 and the standard waveguide flange 33.

FIG. 6A shows a top view detail of the transmitter printed circuit assembly 21 in an embodiment. As shown in FIG. 6A, the communication device 22 is affixed within a cut out area 28 of the printed circuit assembly 21 and is positioned to abut the cut out area edge 29 adjacent to the launch transducer 26. As shown by the shaded area, the cut out area 28 and the top area 25 are copper and gold plated to maintain a continuous electrical ground plane. Low-frequency signal and power connections are supplied to the communication device 22 via a plurality of wire bonds 23 from corresponding wire bond pads 24, although other interconnection technologies besides wire bond pads 24 are contemplated. High-frequency millimeter wave connections are provided between the communication device 22 and the adjacently positioned launch transducer 26 with low-inductance wire or ribbon bonds 27, although other connection technologies are contemplated. The communication device 22 is configured to have a balanced connection at the high-frequency millimeter wave output terminals. Additionally, the launch transducer 26 is implemented with matching balanced transmission line terminals to efficiently accept high-frequency energy from the communication device 22. Launch transducer 26 is located precisely at the midpoint between printed circuit assembly 21 width edges 21A and 21B. Additionally, the launch transducer 26 has a width dimension $Y_t$ that is precisely matched to the standard waveguide flange opening's 33B "b" dimension, as described above with respect to FIG. 4C.

Figure 6B:
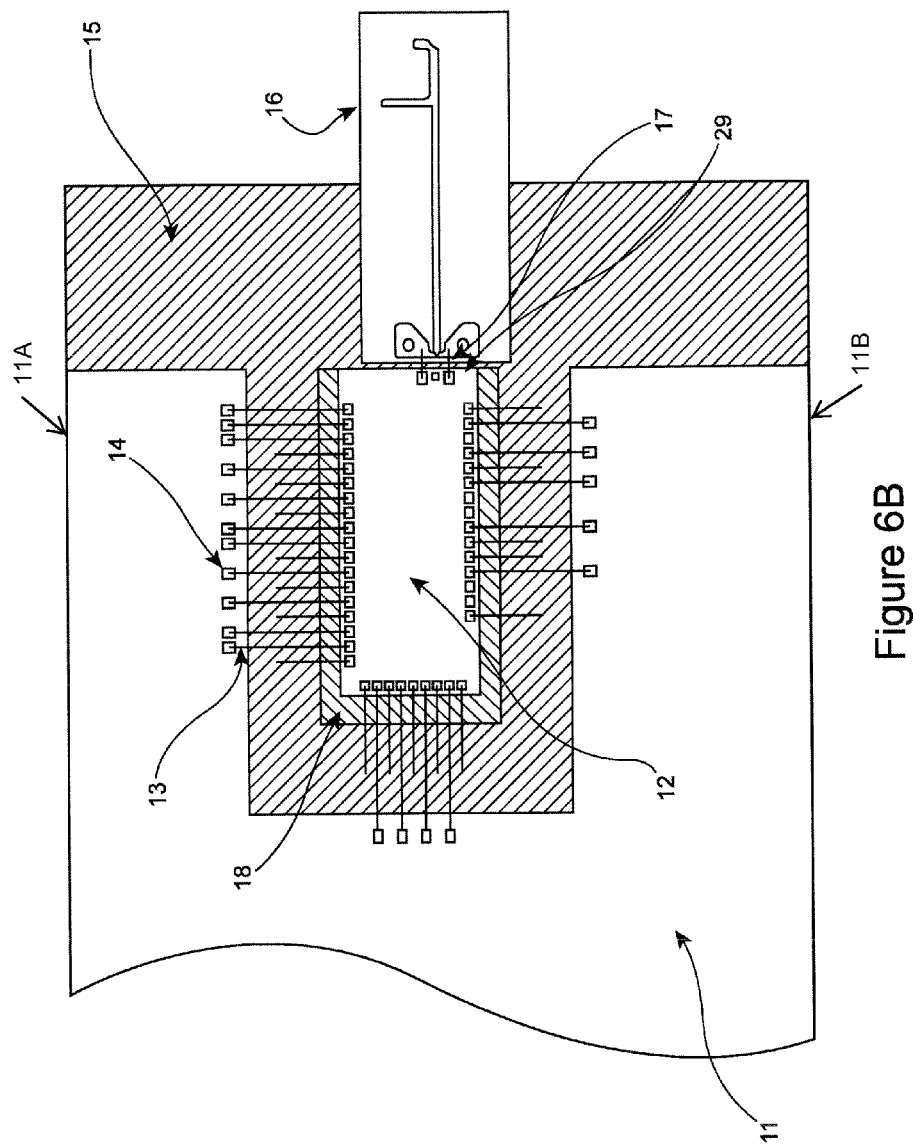
FIG. 6B illustrates a receiver printed circuit board and launch transducer substrate assembly in accordance with an embodiment.

FIG. 6B shows a top view detail of the receiver printed circuit assembly 11 in an embodiment. The communication device 12 is affixed within the printed circuit assembly 11 cut out area 18 and located to abut the cut out area edge 29 adjacent to the launch transducer 16. Printed circuit assembly 11 cut out area 18 and top area 15 are copper and gold plated to maintain a continuous electrical ground plane. Low-frequency signal and power connections from the printed circuit assembly 11 are provided to the communication device 12 via a plurality of wire bonds 13 from corresponding wire bond pads 14, although other interconnection technologies are contemplated. High-frequency millimeter wave connections are communicated between the communication device 12 and the launch transducer 16 with low-inductance wire or ribbon bonds 17, although other connection technologies are contemplated. Communication device 12 has an unbalanced connection at the high-frequency input terminals. Launch transducer 16 is implemented with matching unbalanced transmission line terminals to efficiently deliver high-frequency energy to the communication device 12. Launch transducer 16 is located precisely at the midpoint between printed circuit assembly 11 width edges 11A and 11B. Launch transducer 16 with is precisely matched to the "b" dimension of the waveguide flange opening 33B, as described above with respect to FIG. 4C.

FIG. 7A shows top and bottom views of transmitter launch transducer 26 in an embodiment. As shown in FIG. 7A, the launch transducer 26 is composed of low-loss substrate 263 which has a top metallization pattern and bottom metallization pattern. In an aspect, the substrate 263 is composed of fused silica (silicon dioxide) and is 254 micrometers (μm) thick, although other low-loss substrate materials and other material thickness values are anticipated. The metallization pattern is substantially composed of vacuum deposited gold metal from vacuum deposition techniques or other appropriate methods.

The top metallization pattern of the transmitter launch transducer 26 is composed of two transmission line sections 261, 262. The transmission line sections 261, 262 are preferably implemented over a ground plane 264 on the bottom side of substrate 263. The transmission line sections 261, 262 couples energy from the communication device 22 via bond wires 27 (FIG. 6A) or other means to the transmission line sections 265, 266. Transmission line sections 261, 262 are implemented to match the output impedance of the communication device 22 and the bond wires 27 in a balanced configuration. Transmission line sections 265, 266 are located over a clear substrate section (with no ground plane on the bottom side of substrate 263 in this section) and provides energy from the transmission lines 261, 262 to a pair of corresponding antenna elements 267, 268. Transmission line sections 265, 266 are implemented to match the input impedance of the antenna elements 267, 268. Antenna elements 267, 268 are configured to provide substantial radiation energy in a direction parallel to the substrate 263 and away from transmission line sections 265, 266, thereby forming an end-fire radiation pattern into waveguide flange opening 33B. Launch transducer 26 width dimension, Yt, is matched to be inserted into the standard waveguide flange opening 33B having the "b" dimension described above. In an embodiment, the value of Yt is 1.80 mm and the value of Xt is 2.87 mm, although other values are contemplated.

Figure 7B:
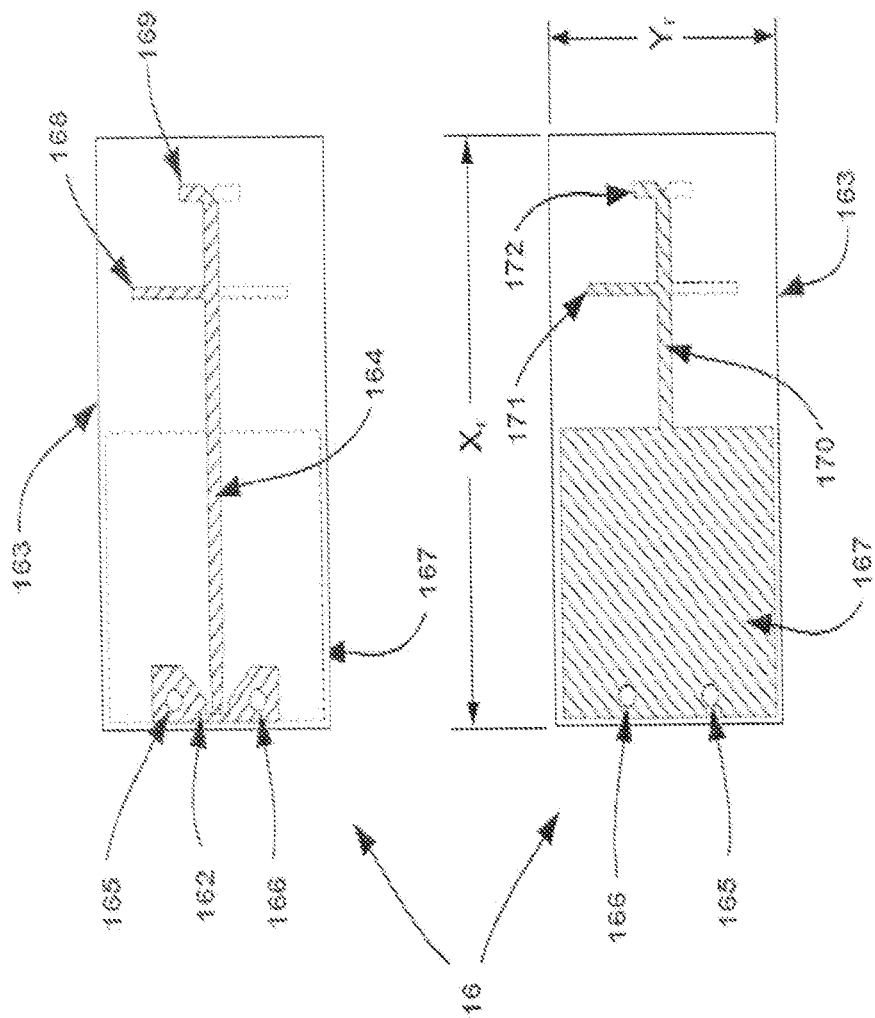
FIG. 7B illustrates a receiver launch transducer substrate in accordance with an embodiment.

FIG. 7B shows top and bottom views of a receiver launch transducer 16 in an embodiment. Launch transducer 16 is composed of a low-loss substrate 163 which has a top metallization pattern and bottom metallization pattern. In an embodiment substrate 163 is composed of alumina (aluminum oxide) and is 127 micrometers (μm) thick. Other low-loss substrate materials and other material thickness values are anticipated. The metallization pattern is substantially composed of vacuum deposited gold metal using vacuum deposition techniques or other appropriate methods.

In an embodiment, the top metallization pattern is composed of an unbalanced transmission line section coupled to a set of antenna elements. Transmission line center conductor 164 traverses a length over ground plane 167 which is on the bottom side of substrate 163. Beyond the position of ground plane 167, the transmission line 164 continues and is positioned over a bottom side transmission line 170. Transmission lines 164 and 170 together couple to antenna elements 168, 169 and 171, 172. Antenna elements 168, 169 and 171, 172 form a dual element dipole and are configured to provide a directional radiation pattern in a direction parallel to substrate 163 and away from transmission lines 164, 170, thereby forming an end-fire radiation pattern into waveguide flange opening 33B, as shown in FIGS. 1B and 3B.

The unbalanced input circuit configuration is composed of a ground connection 162 and a center conductor 164. Ground connection 162 is electrically connected through the substrate 163 and facilitated by metalized plated through holes (also known as vias) 165 and 166, thereby forming a low-inductance connection to ground plane 167 on the bottom side of substrate 163. In an embodiment, the diameter of via holes 165, 166 is 127 micrometers (μm) with gold metallization formed on the inner walls, although other dimensions and material selections are contemplated. Launch transducer 16 width dimension, Yr, is matched to be inserted into the standard waveguide flange opening's 33B "b" dimension. In an embodiment, the value of Yr is 1.80 mm and the value of Xr is 3.58 mm, although other dimensions are contemplated.

The antenna elements 267, 268 of the transmitter launch transducer 26 and antenna elements 168, 169, 171, 172 of the receiver launch transducer 16 are configured to exhibit radio frequency operational bandwidth to be approximately 15% referenced to the center operating frequency range. This operational bandwidth provides for an operating frequency range, whereby the S parameter loss value (known in the art as S21) is to be less than 2 decibels (dB). In an embodiment, launch transducers 26, 16 have an operating frequency range of 57 to 66 GHz, although other frequency ranges of operation and bandwidths are contemplated.

Figure 8:
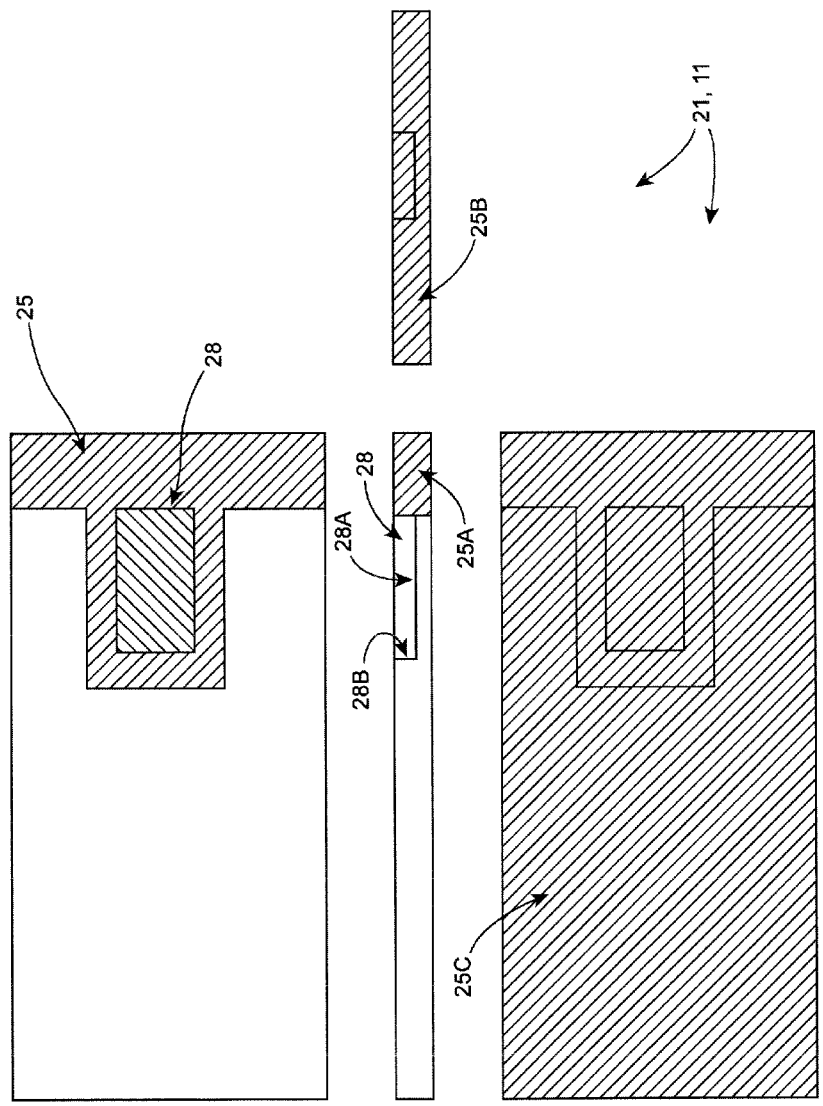
FIG. 8 illustrates four views of a printed circuit board in accordance with an embodiment.

FIG. 8 shows four views of the transmitter printed circuit board 21 in an embodiment. Even though the transmitter printed circuit board 21 is being discussed, the implementation details, as well as all mechanical and electrical characteristics are substantially the same for both transmitter printed circuit board 21 and receiver printed circuit board 11. The cut out area 28 receives the communication device 22 (as shown in FIGS. 6A and 6B), whereby the communication device 22 (as shown in FIGS. 6A and 6B) sits within the recessed cut out bottom surface 28A using a conductive epoxy adhesive. Various conductive epoxy adhesives are known in the art and are not discussed herein. Cutout bottom surface 28A and sides 28B are metallized using standard printed circuit plating techniques. In an aspect, the top ground plane area 25, the side surfaces 25A, the front surface 25B, and the bottom ground plane area 25C are electrically contiguous. Also, the top surface 25 is electrically contiguous with the cutout side surfaces 28B and the bottom surface 28A.

Figure 9:
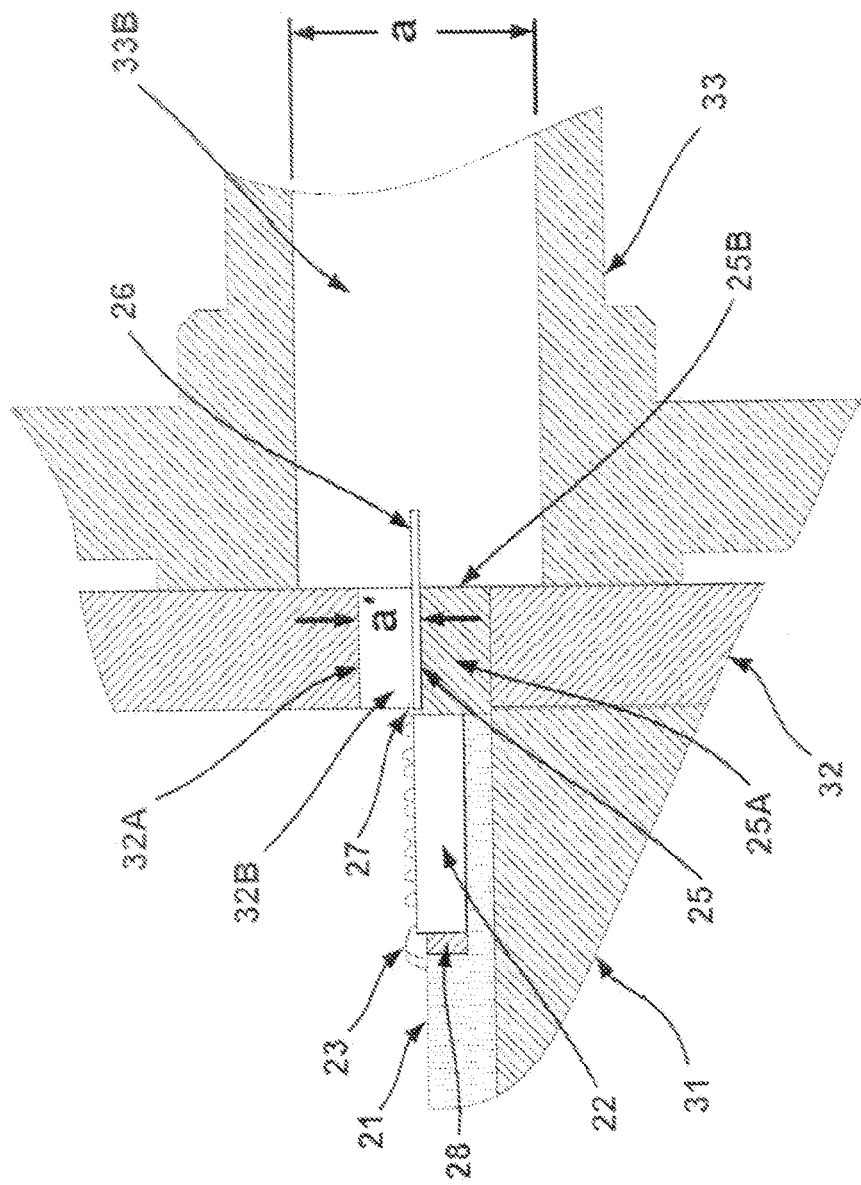
FIG. 9 illustrates a close up cross sectional side view of the waveguide interface in accordance with an embodiment.

FIG. 9 shows a detailed cross sectional view of the transmitter waveguide interface in an embodiment. It should be noted that the detailed description of the transmitter waveguide interface operation applies equally to the receiver waveguide interface with the direction of the millimeter wave transduction and energy reversed. Those of ordinary skill in the art will realize that both the transmission context and the reception context equally apply due to the Lorentz electromagnetic reciprocity theorem. Critical to the high efficiency and operation of the waveguide interface is to facilitate radiation of millimeter wave energy into standard waveguide flange opening 33B and also restrict radiated energy losses as the conducted electrical energy moves from the communications device 22 through the high frequency wire bonds 27 to the transmission lines 261, 262. The short waveguide segment 32B is defined between the upper edge 32A of interface plate 32 and the upper ground plane surface 25 of the printed circuit board assembly 21. Printed circuit board assembly 21 also has contiguous copper plating at surfaces 25A and 25B, forming the lower portion of the short waveguide segment 32B.

Waveguide cutoff frequency is the frequency at which all frequencies below the cutoff frequency are substantially attenuated. Equation [1], derived from the Helmholtz equation for electromagnetic waves, provides the waveguide cutoff frequency for rectangular waveguide with internal H-field "a" dimension and internal E-field "b" dimension.

$$\omega_c = c\sqrt{\left(\frac{n\pi}{a}\right)^2 + \left(\frac{m\pi}{b}\right)^2} \quad [1]$$

In equation [1], $\omega_c$ is radian frequency, c is the speed of light, a is the H-field rectangular waveguide dimension, b is the E-field rectangular waveguide dimension, and n and m represent the waveguide mode numbers. The dominant waveguide mode is used to determine waveguide cutoff and is known in the art as transverse electric mode ($TE_{1,0}$) where n=1 and m=0. With n=1 and m=0, the only variable remaining is the waveguide H-field "a" dimension. For standard waveguide flange 33, the "a" dimension is 3.76 mm which yields a cutoff frequency of 39.9 GHz, well below the intended operating frequency range of standard waveguide flange 33, which is 50 to 75 GHz. However it is desired to substantially attenuate the transduction of energy into radiation over the operating frequency range of the waveguide interface in the short waveguide segment 32B.

The H-field dimension of short waveguide segment 32B is shown as the "a'" dimension in FIG. 9. In an embodiment, the "a'" dimension is approximately 0.98 mm (980 μm). Setting a in equation [1] to 0.98 mm with dominant mode (n=1 and m=0) yields a cutoff frequency of 153 GHz, well above the intended operating range of the waveguide interface. There will be slight variations of the cutoff frequency as the dimension "a'" varies as a function of the printed circuit board thickness and the effective dimension "a'" varies due to the dielectric loading properties and thickness variation of launch transducer 22 and launch transducer 12. However, with all variations taken into account, the minimum waveguide cutoff frequency for either the transmitter waveguide interface or the receiver waveguide interface is greater than 120 GHz. By establishing short segment waveguide 32B cutoff frequency well above the operating frequency range of the waveguide interface, maximum energy is provided to the standard waveguide opening 33B.

What is claimed is:

1. A waveguide interface comprising:
   a launch transducer comprising one or more transmission lines in a first portion of the launch transducer and at least one antenna element coupled to the one or more transmission lines in a second portion of the launch transducer, wherein the at least one antenna element is configured to radiate millimeter wave frequency signals;
   a support block including a printed circuit board, the support block oriented along a plane;
   a communication device coupled to the printed circuit board, wherein the launch transducer is positioned adjacent to and coupled to the communication device;
   a circular interface plate coupled to an end of the support block and oriented perpendicular to the plane, the interface plate having a rectangular slot having predetermined dimensions, wherein the interface plate is positioned flush against a standard waveguide flange such that the narrow dimension of the rectangular slot within the interface plate is orthogonal to a H-field dimension of the standard waveguide flange; and
   a waveguide component coupled to the interface plate, the waveguide component having a waveguide opening, wherein the first portion of the launch transducer is positioned within the rectangular slot such that the rectangular slot prevents energy from the transmission line from being emitted toward the printed circuit board or the waveguide opening and allows energy to pass from the at least one antenna element into the waveguide opening.

2. The waveguide interface of claim 1, wherein the printed circuit board contains a semiconductor chip configured to transmit and receive millimeter wave signals.

3. The waveguide interface of claim 1, wherein the launch transducer further comprises a low-loss dielectric material with deposited metallization.

4. The waveguide interface of claim 1 wherein the launch transducer has an operating frequency range of 57 GHz to 66 GHz.

5. The waveguide interface of claim 1, wherein the second portion of the launch transducer is positioned within the waveguide opening.

6. The waveguide interface of claim 1, wherein the launch transducer is positioned near a top surface of the support block midway between opposing edges of the top surface of the support block.

7. The waveguide interface of claim 1, wherein the communication device is positioned within a recess in the printed circuit board such that the first portion of the launch transducer is at a predetermined height within the rectangular slot.

8. The waveguide interface of claim 1, wherein the launch transducer is configured to provide maximum energy radiation along a central axis of the waveguide component.

9. A method of forming a precision waveguide interface comprising:
- providing a launch transducer comprising one or more transmission lines in a first portion of the launch transducer and at least one antenna element coupled to the one or more transmission lines in a second portion of the launch transducer, wherein the at least one antenna element is configured to radiate millimeter wave frequency signals;
- selecting a support block including a printed circuit board, the support block oriented along a plane;
- coupling a communication device to the printed circuit board;
- coupling the launch transducer to the communication device, wherein the launch transducer is positioned adjacent to the communication device;
- coupling a circular interface plate to an end of the support block and oriented perpendicular to the plane, the interface plate having a rectangular slot having predetermined dimensions, wherein the interface plate is positioned flush against a standard waveguide flange such that the narrow dimension of the rectangular slot within the interface plate is orthogonal to a H-field dimension of the standard waveguide flange; and
- coupling a waveguide component to the interface plate, the waveguide component having a waveguide opening, wherein the first portion of the launch transducer is positioned within the rectangular slot such that the rectangular slot prevents energy from the transmission line from being emitted toward the printed circuit board or the waveguide opening and allows energy to pass from the at least one antenna element into the waveguide opening.

10. The method of claim 9, wherein the printed circuit board contains a semiconductor chip configured to transmit and/or receive millimeter wave signals.

11. The method of claim 9, wherein the launch transducer further comprises a low-loss dielectric material with deposited metallization.

12. The method of claim 9 wherein the launch transducer has an operating frequency range of 57 GHz to 66 GHz.

13. The method of claim 9, wherein the printed circuit board and launch transducer are positioned such that the at least one antenna element is located within an area of a standard waveguide adjacent to the waveguide component.

14. The method of claim 9, wherein the transducer is configured to provide maximum energy radiation along a central axis of the waveguide component axis.

15. The method of claim 9, wherein the second portion of the launch transducer is positioned within the waveguide opening.

16. The method of claim 9, wherein the launch transducer is positioned near a top surface of the support block midway between opposing edges of the top surface of the support block.

17. The method of claim 9, wherein the communication device is positioned within a recess in the printed circuit board such that the first portion of the transducer is at a predetermined height within the rectangular slot.

18. The method of claim 9, wherein the printed circuit board and the launch transducer are coplanar, wherein the launch transducer is at a predetermined height within the rectangular slot.

19. The method of claim 9, wherein the printed circuit board and the launch transducer are coplanar, wherein the launch transducer is at a predetermined height within the rectangular slot.

20. A waveguide interface comprising:
- a launch transducer comprising one or more transmission lines in a first portion of the launch transducer and at least one antenna element coupled to the one or more transmission lines in a second portion of the launch transducer, wherein the at least one antenna element is configured to radiate millimeter wave frequency signals;
- a support block including a printed circuit board, the support block oriented along a plane;
- a communication device coupled to the printed circuit board, wherein the launch transducer is positioned adjacent to and coupled to the communication device;
- a circular interface plate coupled to an end of the support block and oriented perpendicular to the plane, the interface plate having a rectangular slot having predetermined dimensions; and
- a waveguide component coupled to the interface plate, the waveguide component having a waveguide opening, wherein the first portion of the launch transducer is positioned within the rectangular slot such that the rectangular slot prevents energy from the transmission line from being emitted toward the printed circuit board or the waveguide opening and allows energy to pass from the at least one antenna element into the waveguide opening, wherein the printed circuit board and launch transducer are positioned such that the at least one antenna element is located within an area of a standard waveguide adjacent to the waveguide component.

21. The waveguide interface of claim 20, wherein the printed circuit board contains a semiconductor chip configured to transmit and receive millimeter wave signals.

22. The waveguide interface of claim 20, wherein the communication device is positioned within a recess in the printed circuit board such that the first portion of the launch transducer is at a predetermined height within the rectangular slot.

23. The waveguide interface of claim 20, wherein the launch transducer is configured to provide maximum energy radiation along a central axis of the waveguide component.

* * * * *